United States Patent
Yang et al.

(10) Patent No.: US 8,929,137 B2
(45) Date of Patent: *Jan. 6, 2015

(54) OPERATING METHOD OF MEMORY HAVING REDUNDANCY CIRCUITRY

(71) Applicant: Taiwan Semiconductor Manufacturing Company, Ltd., Hsinchu (TW)

(72) Inventors: Tien-Chun Yang, San Jose, CA (US); Yue-Der Chih, Hsinchu (TW); Shang-Hsuan Liu, Zhudong Town (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/168,257

(22) Filed: Jan. 30, 2014

(65) Prior Publication Data

US 2014/0146613 A1    May 29, 2014

Related U.S. Application Data

(60) Division of application No. 13/543,571, filed on Jul. 6, 2012, now Pat. No. 8,670,282, which is a continuation of application No. 12/704,676, filed on Feb. 12, 2010, now Pat. No. 8,238,178.

(51) Int. Cl.
  *G11C 11/34* (2006.01)
  *G11C 29/04* (2006.01)
  *G11C 16/04* (2006.01)
  *G11C 29/00* (2006.01)

(52) U.S. Cl.
  CPC .......... *G11C 29/04* (2013.01); *G11C 16/0483* (2013.01); *G11C 29/808* (2013.01); *G11C 16/0408* (2013.01)

USPC .......... 365/185.09; 365/185.11; 365/185.12; 365/185.33; 365/200

(58) Field of Classification Search
  USPC ............... 365/200, 185.09, 185.11, 185.12, 365/185.33
  See application file for complete search history.

(56) References Cited

U.S. PATENT DOCUMENTS

| | | | |
|---|---|---|---|
| 4,672,581 | A | 6/1987 | Waller |
| 5,313,423 | A | 5/1994 | Sato et al. |
| 5,970,003 | A | 10/1999 | Miyatake et al. |

(Continued)

FOREIGN PATENT DOCUMENTS

| | | |
|---|---|---|
| CN | 1892903 | 1/2007 |
| CN | 101236791 | 8/2008 |
| CN | 10142197 | 4/2009 |
| JP | 2009176386 | 8/2009 |

OTHER PUBLICATIONS

Office Action dated Feb. 21, 2013 from corresponding application No. CN201010570478.X.

(Continued)

*Primary Examiner* — Trong Phan
(74) *Attorney, Agent, or Firm* — Lowe Hauptman & Ham, LLP (57) ABSTRACT

In a method of operating a memory circuit, which includes a plurality of memory arrays each coupled with a corresponding input/output (IO) interface and a redundancy memory page a failing address of a failing bit cell is determined. The failing address is located in a memory page of one of the memory arrays. The method further includes repairing the failing bit cell by replacing the memory page with the redundancy memory page.

20 Claims, 4 Drawing Sheets

(56) References Cited

U.S. PATENT DOCUMENTS

| | | |
|---|---|---|
| 6,310,805 B1 | 10/2001 | Kasa et al. |
| 6,414,896 B1 | 7/2002 | Kim et al. |
| 6,490,208 B2 | 12/2002 | Yoon |
| 6,781,879 B2 | 8/2004 | Tanzawa et al. |
| 6,813,184 B2 | 11/2004 | Lee |
| 6,853,596 B2 | 2/2005 | Cheung |
| 6,914,832 B2 | 7/2005 | Cheung et al. |
| 7,015,743 B2 | 3/2006 | Park et al. |
| 7,027,330 B2 | 4/2006 | Park |
| 7,151,694 B2 | 12/2006 | Meihong et al. |
| 7,184,323 B2 | 2/2007 | Fujisawa |
| 7,236,397 B2 | 6/2007 | Kim |
| 7,251,173 B2 | 7/2007 | Lunde et al. |
| 7,263,011 B2 | 8/2007 | Gouin et al. |
| 7,289,364 B2 | 10/2007 | Zanardi |
| 7,466,611 B1 | 12/2008 | Chen |
| 7,492,650 B2 | 2/2009 | Mito et al. |
| 7,505,319 B2 | 3/2009 | Wu et al. |
| 7,570,526 B2 | 8/2009 | Han |
| 7,623,374 B2 | 11/2009 | Kang |
| 7,633,800 B2 | 12/2009 | Adusumilli et al. |
| 7,733,697 B2 | 6/2010 | Picca et al. |
| 8,031,544 B2 | 10/2011 | Kim et al. |

OTHER PUBLICATIONS

Office Action dated Oct. 24, 2013 from corresponding application No. CN201010570478.X.

|  | IO0 | IO1 | IO2 | IO3 | IO4 | IO5 | IO6 | IO7 | IO8 | IO9 | IO10 | IO11 | IO12 | IO13 | IO14 | IO15 |
|---|---|---|---|---|---|---|---|---|---|---|---|---|---|---|---|---|
|  | RBL(0) | | | | RBL(2) | | | | RBL(4) | | | | RBL(6) | | | |
| Red_read1 | Y0(0) | Y0(1) | Y0(2) | Y0(3) | Y2(0) | Y2(1) | Y2(2) | Y2(3) | Y4(0) | Y4(1) | Y4(2) | Y4(3) | Y6(0) | Y6(1) | Y6(2) | Y6(3) |
| Red_read2 | Y0(4) | Y0(5) | Y0(6) | Y0(7) | Y2(4) | Y2(5) | Y2(6) | Y2(7) | Y4(4) | Y4(5) | Y4(6) | Y4(7) | Y6(4) | Y6(5) | Y6(6) | Y6(7) |
| Red_read3 | Y0(8) | IO_0(0) | IO_0(1) | EN_Y0 | Y2(8) | IO_2(0) | IO_2(1) | EN_Y2 | Y4(8) | IO_4(0) | IO_4(1) | EN_Y4 | Y6(8) | IO_6(0) | IO_6(1) | EN_Y6 |
|  | RBL(1) | | | | RBL(3) | | | | RBL(5) | | | | RBL(7) | | | |
| Red_read4 | Y1(0) | Y1(1) | Y1(2) | Y1(3) | Y3(0) | Y3(1) | Y3(2) | Y3(3) | Y5(0) | Y5(1) | Y5(2) | Y5(3) | Y7(0) | Y7(1) | Y7(2) | Y7(3) |
| Red_read5 | Y1(4) | Y1(5) | Y1(6) | Y1(7) | Y3(4) | Y3(5) | Y3(6) | Y3(7) | Y5(4) | Y5(5) | Y5(6) | Y5(7) | Y7(4) | Y7(5) | Y7(6) | Y7(7) |
| Red_read6 | Y1(8) | IO_1(0) | IO_1(1) | EN_Y1 | Y3(8) | IO_3(0) | IO_3(1) | EN_Y3 | Y5(8) | IO_5(0) | IO_5(1) | EN_Y5 | Y7(8) | IO_7(0) | IO_7(1) | EN_Y7 |
|  | REDPG(0) | | | | REDPG(1) | | | | REDPG(2) | | | | REDPG(3) | | | |
| Red_read7 | X0(3) | X0(4) | X0(5) | X0(6) | X1(3) | X1(4) | X1(5) | X1(6) | X2(3) | X2(4) | X2(5) | X2(6) | X3(3) | X3(4) | X3(5) | X3(6) |
| Red_read8 | X0(7) | X0(8) | X0(9) | X0(10) | X1(7) | X1(8) | X1(9) | X1(10) | X2(7) | X2(8) | X2(9) | X2(10) | X3(7) | X3(8) | X3(9) | X3(10) |
| Red_read9 | X0(11) | EN_X0 | x | x | X1(11) | EN_X1 | x | x | X2(11) | EN_X2 | x | x | X3(11) | EN_X3 | x | x |

INFWL0 → (Red_read1–Red_read3)
INFWL1 → (Red_read4–Red_read6)
INFWL2 → (Red_read7–Red_read9)

OPERATING METHOD OF MEMORY HAVING REDUNDANCY CIRCUITRY

PRIORITY CLAIM

The present application is a continuation of U.S. application Ser. No 13/543,571, (now U.S. Patent No. 8,670,282), filed Jul. 6, 2012, which is a continuation of U.S. application Ser. No. 12/704,676, (now U.S. Patent No. 8,238,178), filed Feb. 12, 2010, which are incorporated herein by reference in their entireties.

TECHNICAL FIELD

The present disclosure relates generally to the field of semiconductor circuits, and more particularly, to operating methods of memories having redundancy circuitry.

BACKGROUND

Flash memories have been used in a variety of electronic applications. Flash memories can provide random access to stored data such as application programs. Flash memory cells can be written to and read from many times. A typical flash memory cell is a modified MOS transistor with a stacked gate. The stacked gate comprises a control gate and a floating gate. The control gate is used to turn the transistor OFF and ON and to thereby control current flow from the drain to the source. The floating gate is placed between the control gate and the device channel. Charge can be injected into or out of the floating gate where it becomes trapped due to the isolation material that surrounds the floating gate. The threshold voltage of the flash transistor cell varies with the charge-state of the floating gate. Binary data values are stored in each flash cell based on the floating gate charge-state.

The process of charging or discharging the floating gate is called erasing or programming. Erasing or programming the flash cell requires that electrons overcome an energy barrier, such as caused by an oxide layer, between the floating gate electrode and the charge source. The energy level of the electrons is raised above this energy barrier value by forcing a relatively large voltage across the barrier. For example, the flash cell may be erased by injecting electrons from the floating gate into the control gate. The control gate is forced to a large positive voltage while the floating gate is capacitively coupled to a low voltage or to a negative voltage. Similarly, the drain, the source, or the channel region of the device may be used to source or to sink electrons during programming and erasing.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

A FLASH memory circuit known to the inventors has a plurality of memory arrays, e.g., 16 memory arrays. Each of the 16 memory arrays is designated with an input/output (IO) interface, e.g., IO0-IO15. The known FLASH memory circuit is subject to defect issues that may result in failures of memory bit cells. To repair the failing memory bit cells, redundancy techniques have been proposed and used.

Several groups, e.g., 16 groups, of redundancy bit lines are configured for repairing the 16 memory arrays. Each of the 16-groups redundancy bit lines can have several redundancy bit lines, e.g., 2 redundancy bit lines. Each of the 16-groups redundancy bit lines is disposed immediately next to one of the 16 memory arrays that it is configured to repair. In other word, each of the 16-groups redundancy bit lines is configured for repairing its corresponding memory array that is designated with a single and specific IO interface.

The applicants have found that if one of the memory arrays does not have any failing bit cell, the redundancy bit lines disposed immediately next to the memory array are not used. The redundancy bit lines cannot be used to repair other memory arrays having different IO interfaces, either. Additionally, if the number of the redundancy bit lines is 2, the redundancy bit lines can repair up to 2 failing bit lines of the memory array. That is, if the memory array that is coupled with a specific IO interface has 3 failing bit lines, the redundancy bit lines cannot repair the memory array. The whole memory circuit is failed.

Furthermore, the FLASH memory circuit has an information row for registering addresses of failing bit cells. The information row has 8 word lines. Bits of a failing address of a failing bit cell are registered in a single word line of the information row. The bits of the failing address are spread out to all IO interfaces IO0-IO15. That is, each bit is registered in one of bit lines that are coupled with the IO interfaces IO0-IO15. By turning on the single word line, the bits stored in the information row coupled with the IO interfaces IO0-IO15 can be simultaneously outputted.

As noted, the bits of the failing address are spread out to all IO interfaces IO0-IO15. The bits are distantly separately registered in the information row. The routing of the redundancy circuit, e.g., latch and/or combination logic for redundancy hit, for accessing the bits of the failing address is complicate and consume a large area.

Based on the foregoing, memory circuits and operating methods thereof are desired.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure relate to regulators regulating a charge pump, memory circuits, and systems thereof. The regulator is capable of enabling or disabling the charge pump with a high frequency and/or controlling variations of an output voltage of the charge pump within a small margin.

Figure 1:
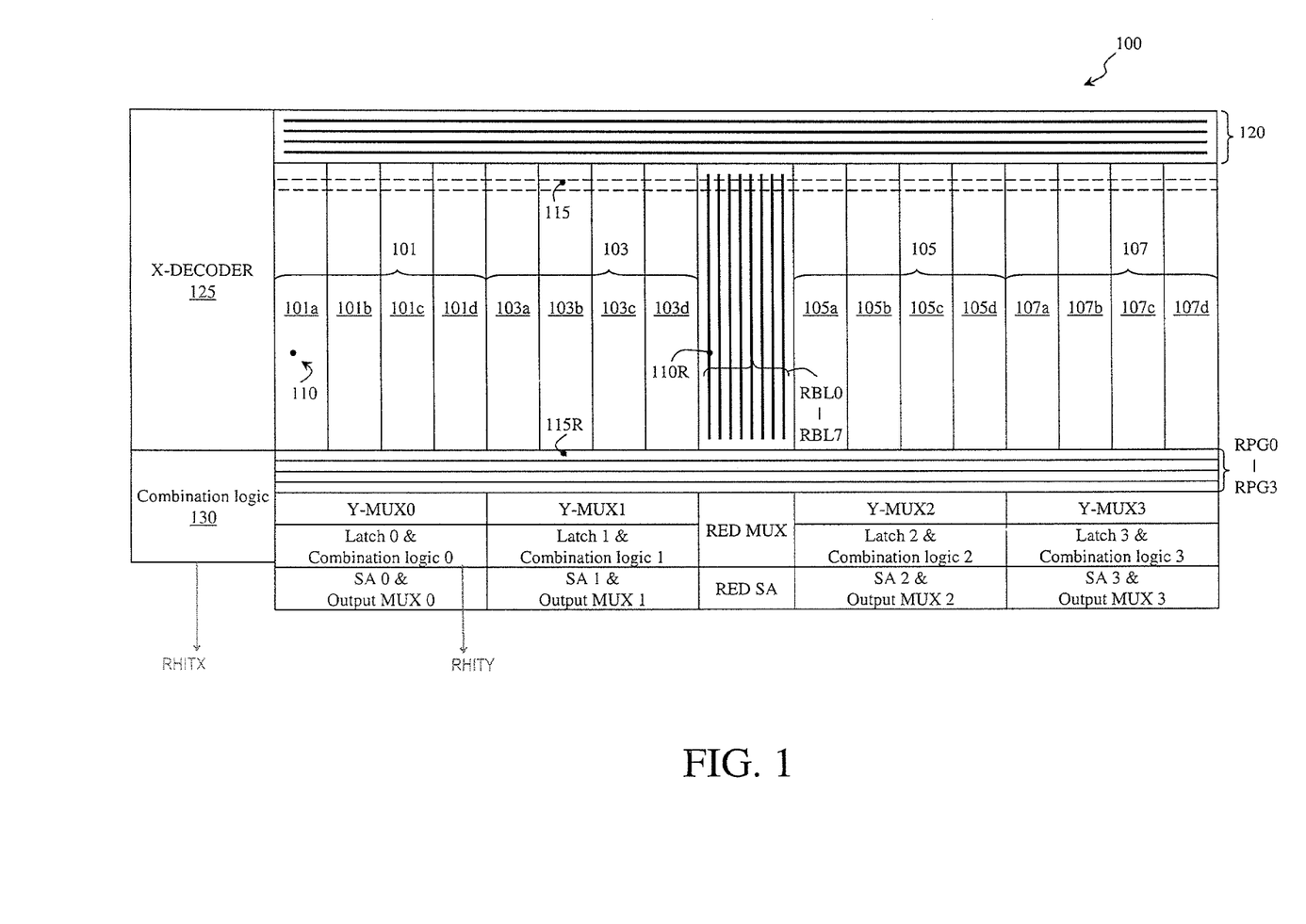
FIG. 1 is a schematic drawing illustrating an exemplary memory circuit.

FIG. 1 is a schematic drawing illustrating an exemplary memory circuit. In FIG. 1, a memory circuit 100 can comprise a plurality of groups of memory arrays, e.g., memory arrays 101, 103, 105, and 107. The memory circuit 100 can be a non-volatile memory, e.g., FLASH, EPROM, E$^2$PROME, a dynamic random access memory (DRAM) circuit, an embedded FLASH memory, an embedded DRAM circuit, a static random access memory (SRAM) circuit, an embedded SRAM circuit, or other memory circuit.

The groups of memory arrays 101, 103, 105, and 107 can include memory arrays 101a-101d, 103a-103d, 105a-105d, and 107a-107d, respectively. Each of the memory arrays 101a-101d, 103a-103d, 105a-105d, and 107a-107d can include a plurality of word lines and a plurality of bit lines. For example, each of the memory arrays 101a-101d, 103a-103d, 105a-105d, and 107a-107d may have 8, 16, 32, 64, 128, 256, 512, or more bit lines and 512, 1024, 2048, 4096, or more word lines. In one or more embodiments, the word lines can be laid out substantially orthogonally to the bit lines. In other embodiments, other arrangements of the word lines and bit lines can be provided. It is noted that the numbers of the groups of memory arrays 101, 103, 105, and 107, and the memory arrays 101a-101d, 103a-103d, 105a-105d, and 107a-107d are merely exemplary. The scope of the disclosure is not limited thereto.

Each of the memory arrays 101a-101d, 103a-103d, 105a-105d, and 107a-107d can be directly or indirectly coupled with an input/output (IO) interface (not shown). Data stored in the memory arrays 101a-101d, 103a-103d, 105a-105d, and 107a-107d can be accessed through their corresponding IO interfaces, e.g., IO0-IO15. Each of the memory arrays 101a-101d, 103a-103d, 105a-105d, and 107a-107d can be coupled with IO0-IO15, respectively.

Referring to FIG. 1, a plurality of redundancy bit lines, e.g., redundancy bit lines RBL0-RBL7, can be disposed adjacent to each other. The redundancy bit lines RBL0-RBL7 can be configured for repairing failing bit cells in the groups of memory arrays 101, 103, 105, and 107. For example, the redundancy bit lines RBL0-RBL1, RBL2-RBL3, RBL4-RBL5, and RBL6-RBL7 can be configured and/or designated for repairing the groups of memory arrays 101, 103, 105, and 107, respectively. That is, the redundancy bit lines RBL0-RBL1, RBL2-RBL3, RBL4-RBL5, and RBL6-RBL7 can be configured and/or designated for repairing the memory arrays 101a-101d, 103a-103d, 105a-105d, and 107a-107d, respectively. For example, each of the redundancy bit lines RBL0-RBL1 can be configured for repairing any bit line of the memory arrays 101a-101d, even if the memory arrays 101a-101d are coupled with different IO interfaces IO0-IO3, respectively.

In one or more embodiments, the redundancy bit lines RBL0-RBL7 can be disposed between the groups of memory arrays 103 and 105. In other embodiments, the redundancy bit lines RBL0-RBL7 can be disposed at the edge of the memory circuit 100 and adjacent to the group of the memory array 107. It is noted that the number of the redundancy bit lines RBL0-RBL7 is merely exemplary. It is also noted that the number of the redundancy bit lines that are designated for repairing each group of the memory arrays 101, 103, 105, and 107 is merely exemplary. The scope of the disclosure is not limited thereto.

In one or more embodiments, the memory circuit 100 can include at least one redundancy page, e.g., redundancy pages RPG0-RPG3 as shown in FIG. 1. The redundancy pages RPG0-RPG3 can be coupled with the groups of memory arrays 101, 103, 105, and 107. Each of the redundancy pages RPG0-RPG3 can be configured for repairing a memory page of the groups of memory arrays 101, 103, 105, and 107 that includes at least one failing bit cell. In one or more embodiments, each of the redundancy pages RPG0-RPG3 may have 16×128, 16×256, 16×512, or more bit lines and 2, 4, 8, or more word lines. In one or more embodiments, the word lines can be laid out substantially orthogonally to the bit lines. In other embodiments, other arrangements of the word lines and bit lines can be provided.

Figure 2:
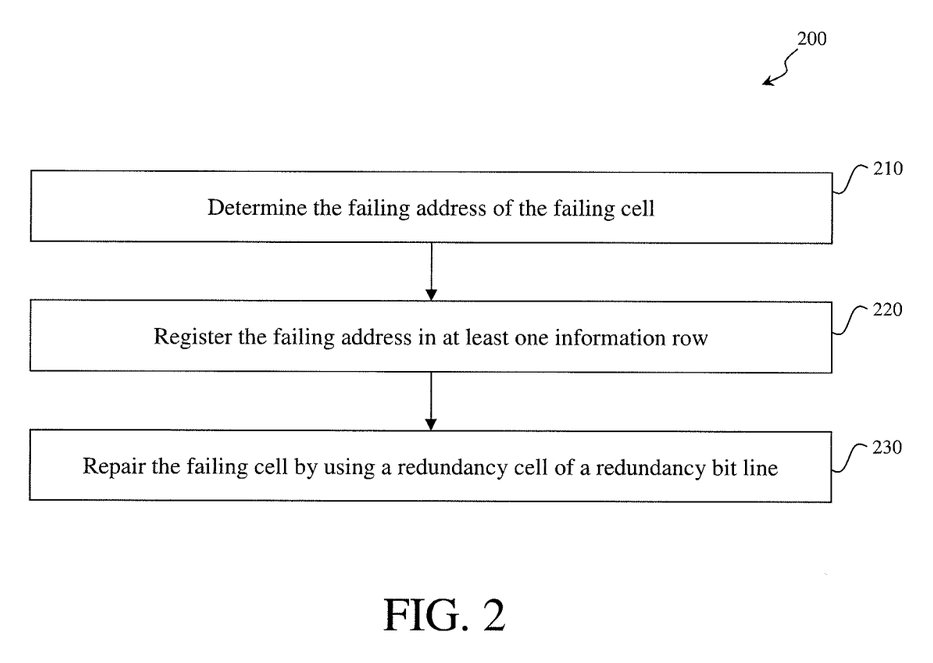
FIG. 2 is a schematic drawing illustrating an exemplary method for operating an exemplary memory circuit.

Following is a description regarding an exemplary method for operating a memory circuit in accordance with one or more embodiments. In FIG. 2, an exemplary method 200 for operating the memory circuit 100 (shown in FIG. 1) can include determining a failing address of a failing bit cell 110 (Step 210). In one or more embodiments, such determining the failing address of the failing bit cell 110 can be performed in a circuit probe (CP) process.

After determining the failing address of the failing bit cell 110, the failing address of the failing bit cell 110 can be registered in at least one information row (Step 220). In one or more embodiments, the memory circuit 100 can include at least one information row, e.g., an information row 120. The information row 120 can be configured to register failing addresses of failing bit cells of the memory arrays 101, 103, 105, and 107. In one or more embodiments, the information row 120 may have 16×128, 16×256, 16×512, or more bit lines and 2, 4, 8, or more word lines, e.g., INFWL0-INFWL3. Bits of the failing address of the failing bit cell 110 can be stored in different word lines of the information row 120. For example, each of the memory arrays 110a-110d can have 512 bit lines. To identify the failing address of the failing bit cell 110 in the memory array 110a, the failing address can have, for example, 12 bits as shown in FIG. 3.

In one or more embodiments, the first 9 bits Y0(0)-Y0(8) of the failing address can identify which one of the 512 bit lines where the failing bit cell 110 is located. The last 3 bits IO_0(0), IO_0(1), and EN_Y0 of the failing address can identify which one of the IO0-IO3 where the failing bit line of the failing bit cell 110 is coupled with. As shown, the first 4 bits Y0(0)-Y0(3) can be stored in the word line INFWL0 corresponding to row Red_read1, the second 4 bits Y0(4)-Y0(7) can be stored in the word line INFWL1 corresponding to row Red_read2, and the last 4 bits Y0(8), IO_0(0), IO_0(1), and EN_Y0 can be stored in the word line INFWL2 corresponding to row Red_read3. By sequentially turning on the word lines INFWL0-INFWL2, the failing address of the failing bit cell 110 can be accessed. In one or more embodiments, sequentially turning on the word lines INFWL0-INFWL2 can be referred to as a multiple-read process.

Figure 3:
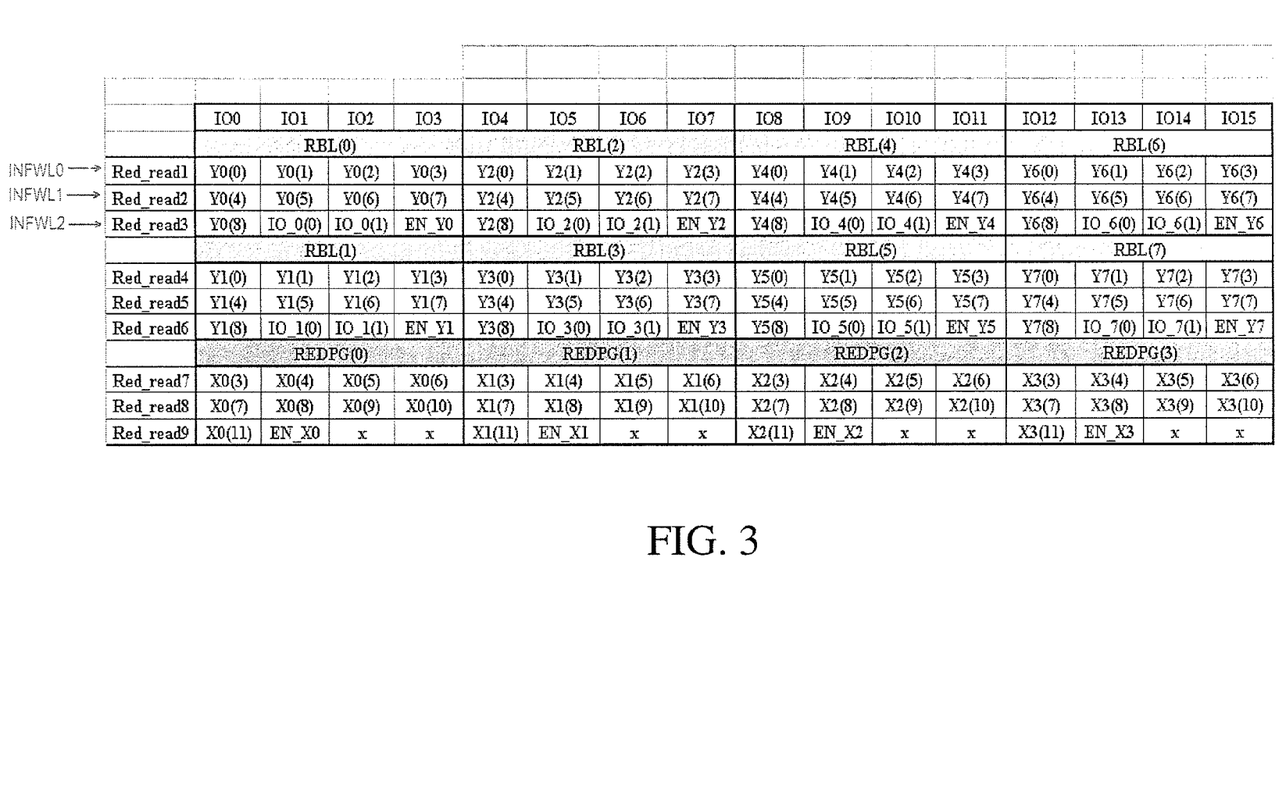
FIG. 3 is a schematic drawing illustrating data stored in an exemplary information row.

Like the failing bit cell 110, failing addresses of other failing bit cells (not shown) that are located in the groups of the memory arrays 101, 103, 105, and 107 can be registered in the information row 120 as shown in FIG. 3, which can be represented by Yi(0)-Yi(8), IO_i(0)-IO_i(1), and EN_Yi in corresponding rows Red_readj, where i is 1 to 7, and j is 1 to 6. By the multiple-read process, the failing addresses of the failing bit cells can be outputted. In one or more embodiments, the method using several word lines to register bits of a failing address can be referred to as an address scramble.

As noted, the bits of the failing address can be stored in at least two word lines of the information row 120, instead of a single word line. The failing address of the failing bit cell 110 can be stored in four bit lines, each of which is coupled with one of the IO interfaces IO0-IO3. The repairing efficiency can be desirably achieved.

Referring to FIG. 2, after registering the failing address of the failing bit cell 110, the failing bit cell 110 can be repaired and/or replaced by a redundancy bit cell 110R of the redundancy bit line RBL0 (Step 230). For example, the redundancy bit cell 110R can be used to store the datum that is intended to be stored in the failing bit cell 110. After storing the datum that is intended to be stored in the failing bit cell 110 in the redundancy bit cell 110R, the datum stored in the redundancy bit cell 110R can be accessed.

As noted, the redundancy bit line RBL0 can be configured for repairing any bit line of the memory arrays 101a-101d that are coupled with the IO interfaces IO0-IO3, respectively. The redundancy bit line RBL0 can be selected for repairing any bit line that can be disposed in the memory arrays coupled with different IO interfaces.

Following is a description regarding an exemplary method for verifying and/or accessing the datum stored at the failing address of the failing bit cell 110. As noted, the redundancy bit cell 110R is used to replace the failing bit cell 110 and/or store the datum that is intended to be stored in the failing bit cell 110. After repairing the failing bit cell 110, the datum stored in the redundancy bit cell 110R can be accessed.

Referring to FIG. 1, the memory circuit 100 can include a plurality of multiplexers, e.g., multiplexers Y-MUX0-Y-MUX3, a plurality of latches, e.g., Latches 0-3, a plurality of combination logics for hit, e.g., combination logics 0-3, a plurality of sense amplifiers, e.g., sense amplifiers SA0-SA3, and a plurality of output multiplexers, e.g., output multiplexers MUX0-MUX3. The multiplexers Y-MUX0-Y-MUX3, Latches 0-3, combination logics 0-3, sense amplifiers SA0-SA3, and output multiplexers MUX0-MUX3 can be coupled with the groups of memory arrays 101, 103, 105, and 107, respectively.

In one or more embodiments, the memory circuit 100 can include a redundancy multiplexer RED MUX coupled with the redundancy bit lines RBL0-RBL7. A redundancy sense amplifier RED SA can be coupled with the redundancy multiplexer RED MUX. The redundancy sense amplifier RED SA can be coupled with the output multiplexers MUX0-MUX3.

In one or more embodiments, the failing address of the failing bit cell 110 stored in the information row 120 can be downloaded and/or registered in the Latch 0. After the failing address of the failing bit cell 110 is stored in the Latch 0, the combination logic 0 can compare the failing address of the failing bit cell 110 with an external address. The external address can represent the address of a bit cell that is to be accessed. In one or more embodiments, the external address can be provided out of the memory circuit 100, e.g., from a processor.

In one or more embodiments, if the failing address matches the external address, the combination logic 0 can output a redundancy hit signal RHITY having a state, e.g., a high state, to enable the redundancy bit line RBL0. For example, the datum stored in the failing bit cell 110 can be sent to the output MUX0. The combination logic 0 can output the redundancy hit signal RHITY to the redundancy multiplexer RED MUX such that the datum stored in the redundancy bit cell 110R of the redundancy bit line RBL0 can be sent to the output multiplexer MUX0. The output multiplexer MUX0 can receive a control signal, outputting the datum stored in the redundancy bit cell 110R instead of the datum stored in the failing bit cell 110.

If the failing address does not match the external address, the combination logic 0 can output a redundancy hit signal RHITY having a state, e.g., a low state, to disable the redundancy bit line RBL0. For example, the combination logic 0 can output the redundancy hit signal RHITY to the redundancy multiplexer RED MUX such that the datum stored in the redundancy bit cell of the redundancy bit line RBL0 can not be sent to the output multiplexer MUX0.

As noted, each of the redundancy pages RPG0-RPG3 can be configured for repairing any memory page of the memory circuit 100 that includes failing bit cells. After the failing bit cell in a memory page is replaced by a redundancy bit cell of one of the redundancy pages RPG0-RPG3, the datum stored in the redundancy bit cell of one of the redundancy pages RPG0-RPG3 can be accessed. The redundancy pages RPG0-RPG3 are shown in FIG. 3 as REDPG(0)-REDPG(3), respectively, and have 12 bits per redundancy page, including Xi(3)-Xi(11), EN_Xi, and the last 2 bits of x in corresponding rows Red_readj, where i is 0 to 3, and j is 7-9). Following is a description regarding an exemplary method for verifying and/or accessing the datum stored at the failing address of a failing bit cell 115. For example, the redundancy page RPG0 including a redundancy bit cell 115R is used to repair and/or replace the memory page including the failing bit cell 115.

As noted, the FLASH redundancy circuit known to the applicants uses a single word line to register all bits of the failing address. The bits of the failing address are spread out to all IO interfaces. Since the bits are distantly separately registered in the information row, the routing of the known redundancy circuit is complicate and consumes a large area.

In contrary, the memory circuit 100 can use the word lines INFWL0-INFWL2 to store the bits of the failing address of the failing bit cell 110. The failing address of the failing bit cell 110 can be stored in the local portion of the information row 120 which is associated with the IO interfaces IO0-IO3. Since the IO interfaces IO0-IO3 are coupled with the memory arrays 101a-101d, respectively, the repairing and/or accessing the data stored in the memory arrays 101a-101d can be substantially locally. The routing of the Latch 0 and the combination logic 0 can be substantially locally and easily. Like the Latch 0 and the combination logic 0, the routings of the Latch 1-3 and the combination logics 1-3 can be substantially locally and easily. The routing of the redundancy circuit of the memory array 100 can be desirably achieved.

Referring to FIG. 1, the memory circuit 100 can include an X-decoder 125. The X-decoder 125 can be coupled with the groups of memory arrays 101, 103, 105, and 107. In one or more embodiments, the memory circuit 100 can include a combination logic 130 for redundancy hit. The combination logic 130 can be coupled with the X-decoder 125 and the redundancy pages RPG0-RPG3.

In one or more embodiments, the failing address of the failing bit cell 115 stored in the information row 120 can be downloaded and/or registered in the Latch 1. The combination logic 130 can compare the failing address of the failing bit cell 115 with an external address. The external address can represent the address of a bit cell that is to be accessed.

In one or more embodiments, if the failing address matches the external address, the combination logic 130 can output a redundancy hit signal RHITX having a state, e.g., a high state, to enable the redundancy page RPG0. The redundancy hit signal RHITX can also be transmitted to the X-decoder 125 to disable the memory page including the failing bit cell 115. By disabling the memory page and enabling the redundancy page RPG0, the datum stored in the redundancy bit cell 115R of the redundancy page RPG0 can be sent to the multiplexer Y-MUX1 and then outputted.

If the failing address does not match the external address, the combination logic 130 can output a redundancy hit signal RHITX having a state, e.g., a low state, to disable the redundancy pages RPG0-RPG3. No data stored in bit cells of the redundancy pages RPG0-RPG3 will be outputted.

Figure 4:
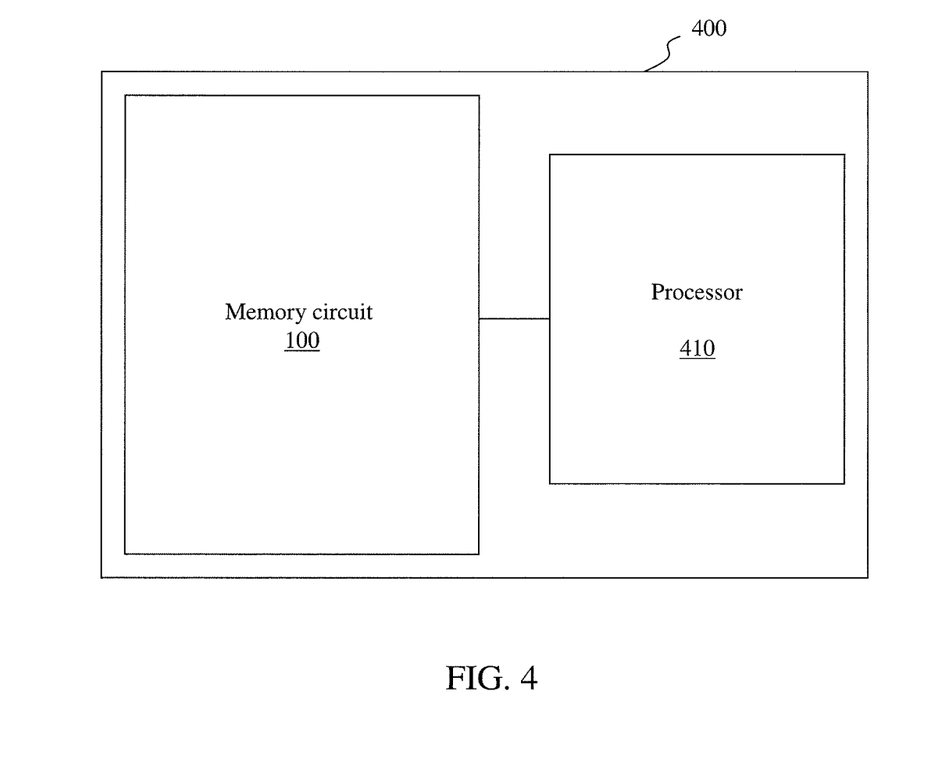
FIG. 4 is a schematic drawing illustrating a system comprising an exemplary memory circuit and a processor.

FIG. 4 is a schematic drawing showing a system including an exemplary memory circuit. In FIG. 4, a system 400 can include a processor 410 coupled with the memory circuit 100. In one or more embodiments, the processor 410 can be a processing unit, central processing unit, digital signal processor, or other processor that is suitable for accessing data of memory circuit.

In one or more embodiments, the processor 410 and the memory circuit 100 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In one or more embodiments, the system 400 including the memory circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

Some embodiments provide a method of operating a memory circuit which includes a plurality of memory arrays each coupled with a corresponding input/output (IO) interface, and a redundancy memory page. The method includes determining a failing address of a failing bit cell. The failing address is located in a memory page of one of the memory arrays. The method further includes repairing the failing bit cell by replacing the memory page with the redundancy memory page.

In some embodiments, a method of operating a memory circuit includes determining a first failing address of a first failing bit cell located in a first group of memory arrays. The first group of memory arrays includes a first memory array coupled with a first input/output (IO) interface and a second memory array coupled with a second IO interface. The method further includes repairing the first failing bit cell by using a redundancy memory page. The redundancy memory page is configured to selectively repair any memory page of the first and second memory arrays of the first group of memory arrays.

In some embodiments, a method of operating a memory circuit includes determining a first failing address of a first failing bit cell and repairing the first failing bit cell. The first failing bit cell is located in a first group of memory arrays. The first group of memory arrays includes a first memory array coupled with a first input/output (IO) interface and a second memory array coupled with a second IO interface. The repairing the first failing bit cell comprises using a redundancy cell coupled to a first redundancy bit line. The first redundancy bit line is configured to selectively repair any bit line of the first and second memory arrays of the first group of memory arrays.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a memory circuit,
the memory circuit comprising:
a plurality of memory arrays each coupled with a corresponding input/output (IO) interface;
at least one information row, and
a redundancy memory page;
the method comprising:
determining a failing address of a failing bit cell, wherein the failing address is located in a memory page of one of the memory arrays;
registering bits of the failing address in the at least one information row, wherein the at least one information row includes a plurality of word lines; and
repairing the failing bit cell by replacing the memory page with the redundancy memory page.

2. The method of claim 1, further comprising:
configuring at least two word lines of the plurality of word lines to register the bits of the failing address.

3. The method of claim 1, further comprising:
downloading the failing address from the at least one information row by a multiple read process.

4. A method of operating a memory circuit, the method comprising:
determining a first failing address of a first failing bit cell located in a first group of memory arrays, wherein the first group of memory arrays includes a first memory array coupled with a first input/output (IO) interface and a second memory array coupled with a second IO interface;
registering bits of the first failing address in at least one information row; and
repairing the first failing bit cell;
wherein the repairing the first failing bit cell comprises using a redundancy memory page, wherein the redundancy memory page is configured to selectively repair any memory page of the first and second memory arrays of the first group of memory arrays.

5. The method of claim 4, further comprising:
repairing a second failing bit cell located in a second group of memory arrays, wherein the second group of memory arrays includes a third memory array coupled with a third IO interface and a fourth memory array coupled with a fourth IO interface;
wherein the repairing the second failing bit cell comprises using a redundancy cell coupled to a redundancy bit line.

6. The method of claim 5, further comprising:
configuring the redundancy bit line to selectively repair any of the third and fourth memory arrays of the second group of memory arrays.

7. The method of claim 5, further comprising:
comparing the second failing address and an external address, and
if the second failing address matches the external address, enabling the redundancy bit line, and
if the second failing address does not match the external address, disabling the redundancy bit line.

8. The method of claim 4, wherein said registering comprises receiving the bits of the first failing address in a plurality of word lines of the at least one information row.

9. The method of claim 8, further comprising:
configuring at least two word lines of the plurality of word lines to register the bits of the first failing address.

10. The method of claim 9, further comprising:
downloading the first failing address from the at least one information row by a multiple read process.

11. The method of claim 4, further comprising:
determining a second failing address of a second failing bit cell located in a second group of memory arrays, wherein the second group of memory arrays includes a third memory array coupled with a third IO interface and a fourth memory array coupled with a fourth TO interface; and
repairing the second failing bit cell by replacing a bit line coupled to the second failing bit cell with a redundancy bit line.

12. The method of claim 11, further comprising:
configuring the redundancy bit line for selectively repairing any bit line in the second group of memory arrays.

13. A method of operating a memory circuit, the method comprising:
determining a first failing address of a first failing bit cell located in a first group of memory arrays, wherein the first group of memory arrays includes a first memory array coupled with a first input/output (IO) interface and a second memory array coupled with a second TO interface;
registering bits of the first failing address in at least one information row; and
repairing the first failing bit cell;
wherein the repairing the first failing bit cell comprises using a redundancy cell coupled to a first redundancy bit line, wherein the first redundancy bit line is configured to selectively repair any bit line of the first and second memory arrays of the first group of memory arrays.

14. The method of claim 13, further comprising:
comparing the first failing address with an external address, and
if the first failing address matches the external address, enabling the first redundancy bit line, and
if the first failing address does not match the external address, disabling the first redundancy bit line.

15. The method of claim 13, further comprising:
repairing a second failing bit cell located in a second group of memory arrays, wherein the second group of memory arrays includes a third memory array coupled with a third IO interface and a fourth memory array coupled with a fourth IO interface;
wherein the repairing the second failing bit cell comprises using a redundancy cell coupled to a second redundancy bit line, wherein the second redundancy bit line is configured to selectively repair any of the third and fourth memory arrays of the second group of memory arrays.

16. The method of claim 15, further comprising:
repairing a third failing bit cell located in a memory page of the first group of memory arrays or the second group of memory arrays;
wherein said repairing the third failing bit cell comprises replacing the memory page with a redundancy page.

17. The method of claim 13, wherein said registering comprises receiving the bits of the first failing address in at least one information row.

18. The method of claim 17, further comprising:
downloading the first failing address from the at least one information row by a multiple read process.

19. The method of claim 17, further comprising:
comparing the first failing address and an external address, and
if the first failing address matches the external address, enabling the first redundancy bit line, and
if the first failing address does not match the external address, disabling the first redundancy bit line.

20. The method of claim 13, further comprising:
determining a second failing address of a second failing bit cell located in a second group of memory arrays, wherein the second group of memory arrays includes a third memory array coupled with a third IO interface and a fourth memory array coupled with a fourth IO interface; and
repairing the second failing bit cell by replacing a bit line coupled to the second failing bit cell with a redundancy bit line.

* * * * *